United States Patent
Van Roosmalen et al.

[11] Patent Number: 6,124,624
[45] Date of Patent: Sep. 26, 2000

[54] Q INDUCTOR WITH MULTIPLE METALLIZATION LEVELS

[75] Inventors: Marcel Wilhelm Rudolf Martin Van Roosmalen, Hengelo; Maurice Verreck, Nijmegen, both of Netherlands

[73] Assignee: Telefonaktiebolaget LM Ericsson, Stockholm, Sweden

[21] Appl. No.: 09/031,594

[22] Filed: Feb. 27, 1998

[30] Foreign Application Priority Data

Feb. 28, 1997 [EP] European Pat. Off. .............. 97200594

[51] Int. Cl.⁷ .................................................. H01L 29/41
[52] U.S. Cl. ........................................... 257/531; 336/186
[58] Field of Search ...................... 257/531; 336/186–200

[56] References Cited

U.S. PATENT DOCUMENTS

| | | | |
|---|---|---|---|
| 3,614,554 | 10/1971 | Richardson et al. ............... | 317/235 R |
| 4,918,417 | 4/1990 | Sakamoto ................................... | 336/83 |
| 5,416,356 | 5/1995 | Staudinger et al. ..................... | 257/531 |
| 5,446,311 | 8/1995 | Ewen et al. .............................. | 257/531 |
| 5,559,360 | 9/1996 | Chiu et al. ............................... | 257/531 |
| 5,583,470 | 12/1996 | Okubo ...................................... | 336/200 |

FOREIGN PATENT DOCUMENTS

0559074A1  9/1993  European Pat. Off. .
0725407A1  8/1996  European Pat. Off. .

*Primary Examiner*—David Hardy
*Attorney, Agent, or Firm*—Burns, Doane, Swecker & Mathis, L.L.P.

[57] ABSTRACT

In an integrated circuit, such as an RF oscillator device, having multiple mutually separated levels of electrically conducting material, each level comprises a plurality of adjacently arranged strips separated from another. Strips of different levels are electrically parallel connected, forming a plurality of stacks of parallel connected strips. The stacks are connected to form an inductor having a first and second terminal.

14 Claims, 3 Drawing Sheets

Q INDUCTOR WITH MULTIPLE METALLIZATION LEVELS

This application claims priority under 35 U.S.C. §§119 and/or 365 to EP 97200594.6 filed in Europe on Feb. 28, 1997; the entire content of which is hereby incorporated by reference.

FIELD OF THE INVENTION

The present invention generally relates to the design and construction of electrical inductors and, more particularly, to a novel inductor structure in integrated circuits.

BACKGROUND OF THE INVENTION

Typical planar inductors of integrated circuits are two-port devices consisting of a number of planar windings wound as a spiral having a rectangular, circular, elliptical or polygonal shape such as disclosed by U.S. Pat. No. 5,416,356.

A widely used figure of merit for (planar) inductors is the quality (Q)-factor, which is the ratio between the amount of magnetic energy stored in the inductor and the power dissipated. Q is related to the inductors impedance as:

$$Q = \frac{\text{Im}(Z)}{\text{Re}(Z)} \quad (1)$$

wherein:

Q=quality factor

Z=complex impedance of the inductor

Im(Z)=imaginary part of Z

Re(Z)=real part of Z.

The complex impedance Z is measured across the terminals of the inductor. Neglecting capacitive effects, the Q-factor is roughly determined by:

$$Q = \frac{L}{Rs} = \frac{Ls + Lm}{Rs} \quad (2)$$

wherein:

L=total inductance of the inductor

Ls=self inductance of the inductor

Lm=mutual inductance of the inductor

Rs=Direct Current (DC) resistance of the inductor.

The total inductance of the inductor can be divided into a self inductance part, caused by the interaction between the current in a winding and its own generated magnetic field, and a mutual inductance part caused by the interaction between the current in a winding and the magnetic field generated by an adjacent winding or adjacent windings.

Since, as can be seen from (2), Q is inversely proportional to the DC resistance of the inductor, one way to reduce the DC resistance of a planar inductor is to increase the line width of its windings. However, this leads to a decrease of both the mutual and self inductance, whereas it increases the inductor area and the parasitic capacitance associated with the structure. Another measure is to increase the line thickness of the windings. There is, however, an upper limit from a process point of view. In addition, the well known skin effect will make line thicknesses in excess of 4 μm (at frequencies from 2 GHz) not effective.

Increase of the bulk conductivity of the electrically conducting material, i.e. the metal of which the windings are formed, by using gold, silver or copper, will in practical cases not lead to an improvement because, for example, in Gallium Arsenide (GaAs) foundries gold is already used.

U.S. Pat. No. 5,446,311 discloses a manner for reducing the total DC resistance of an inductor by providing spiral planar inductors in different levels of metal, and wherein oppositely positioned windings or turns of the inductors are electrically parallel connected. The reduction in DC resistance depends on the number of parallel connected windings, resulting in an enhancement of the Q factor of the so-formed inductor.

Most of the silicon technologies at present have at least three or more electronically conducting layers of metal for wiring of the circuit. Besides the relatively large surface area occupied by a planar spiral conductor, wherein the region surrounded by the inner most winding is not used for arranging circuit elements, one of the layers or levels of metal has to be used as a cross-under to make a connection of the inner winding of the spiral structure to circuitry of the substrate external to the inductor. Accordingly, only two levels of metal can be used for the inductor windings or turns for the purpose of increasing the Q-factor of a planar inductor.

U.S. Pat. No. 5,559,360 discloses an inductor for semiconductor devices, comprising multiple mutually separated levels of electrically conducting material. Each level comprises a plurality of adjacently arranged strips separated from another. Strips of different levels are electrically series connected which increases the resistance of the individual inductor elements. Those skilled in the art will appreciate that this design does not provide an approach for a high Q inductor.

SUMMARY OF THE INVENTION

It is therefore an object of the present invention to provide a new approach for high Q inductor design on integrated circuits.

It is a further object of the present invention to provide an integrated circuit comprising a novel inductor structure, in particular an integrated circuit comprising an oscillator device for frequencies up to 2 GHz and above.

These and other objects and advantages of the present invention are provided by an improved Q inductor structure formed in an integrated circuit comprising multiple mutually separated levels of electrically conducting material. Each level comprises a plurality of adjacently arranged strips separated from another. A strip comprises a first and a second end. Strips of different levels are electrically parallel connected such to form a plurality of stacks of parallel connected strips. By interconnecting the stacks an inductor is formed having a first and second terminal.

By forming stacks of parallel connected strips and by interconnecting the strips to finally form an inductor, the need for a bridging cross-under (or a bridging cross-over) to make a connection to the terminal of the inner winding of a spiral inductor is avoided. The interconnections of the stacks can be provided in one of the electrically conducting levels of the inductor. Accordingly, all the available conducting levels of conventional integrated circuit technology can be efficiently use to contribute to the total inductance of the inductor and to reduce the DC resistance thereof by parallel connection, such to enhance the Q of the inductor.

In a preferred embodiment of the novel inductor according to the invention, the stacks are connected in parallel having the first terminal at the interconnected first ends of the strips and having the second terminal at the interconnected second ends of the strips. The DC resistance of such an inductor is extremely low (typically <<1 ohm) and its inductance is typical in the range of 1 nH.

Q values in excess of 25 will be possible. The exact value depends on the process parameters, i.e. width, length, thickness and the number of strips, for example.

To achieve a higher inductance, in a further embodiment of the invention, the stacks are series connected to form an inductor is having its first terminal at a first end and its second terminal at a second end of the series connection. Compared to the above parallel-parallel structure, the series-parallel structure has a higher DC resistance, resulting in a lower Q-factor, however this Q-factor is still higher compared to the prior art spiral inductors using the same number of levels of electrically conducting material, i.e. levels of metalization of an integrated circuit and occupying an equivalent surface area.

The strips of different levels are preferably oppositely arranged, to achieve the highest mutual induction. However, to reduce spurious capacitances between oppositely arranged strips of different levels, the strips may be staggeredly arranged. Of a particular level, the strips are preferably arranged in parallel such to achieve maximum mutual inductance.

The strips may take any form, however for ease of modelling, a rectangular elongated shape is preferred.

Due to its improved Q, the inductor structure according to the invention is in particular suitable for providing monolithic low-phase-noise oscillators for use at frequencies up to 2 GHz and even higher.

The inductor of the invention can be formed with any conventional integrated circuit technology, wherein the multiple levels of electrically conducting material are formed on a semiconductor substrate such as silicon and gallium arsenide. The levels being separated by electrically insulating layers such as silicon dioxide, and wherein the electrically conducting material is a metal such as aluminum, silver, copper, tungsten alloy, gold and the like.

The inductor of the invention is in particular suitable for use with the so-called "back etching" integrated circuit technology, wherein planarisation of the surface of an integrated semiconductor device is achieved by a local removal of the substrate. Other "lift-off" techniques may be applied as well to provide the inductor structure according to the present invention.

BRIEF DESCRIPTION OF THE DRAWINGS

The forgoing and other features, aspects and advantages of the invention will be better understood from the following description with reference to the enclosed drawings, in which.

DETAILED DESCRIPTION OF THE EMBODIMENTS

Figure 1:
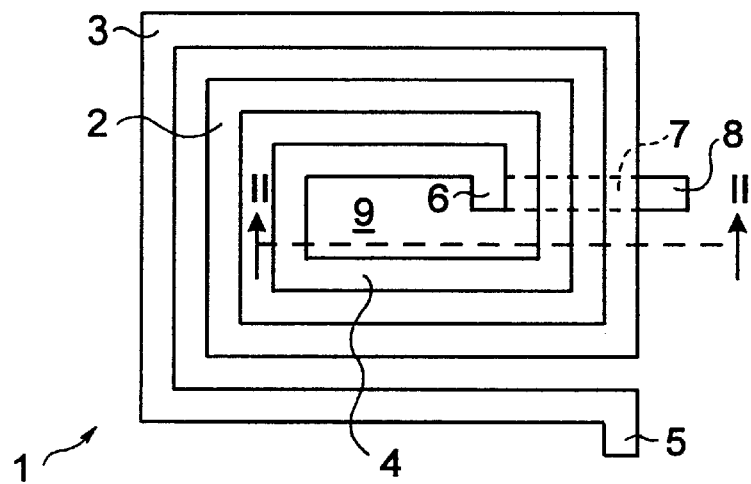
FIG. 1 is a schematic plan view of a typical prior art multi level spiral planar inductor.

FIG. 1 shows a plan view of a prior art planar inductor structure 1. The inductor 1 comprises windings or turns 2 having an outer winding 3 and an inner winding 4. The outer winding 3 terminates in a first terminal 5 and the inner winding 4 terminates in a central terminal 6. For the connection to external circuitry, i.e. external to the outer winding 3 of the inductor 1, a bridge or cross-under 7 connects the central terminal 6 of the inner winding 4 to a second terminal 8 of the inductor 1.

Figure 2:
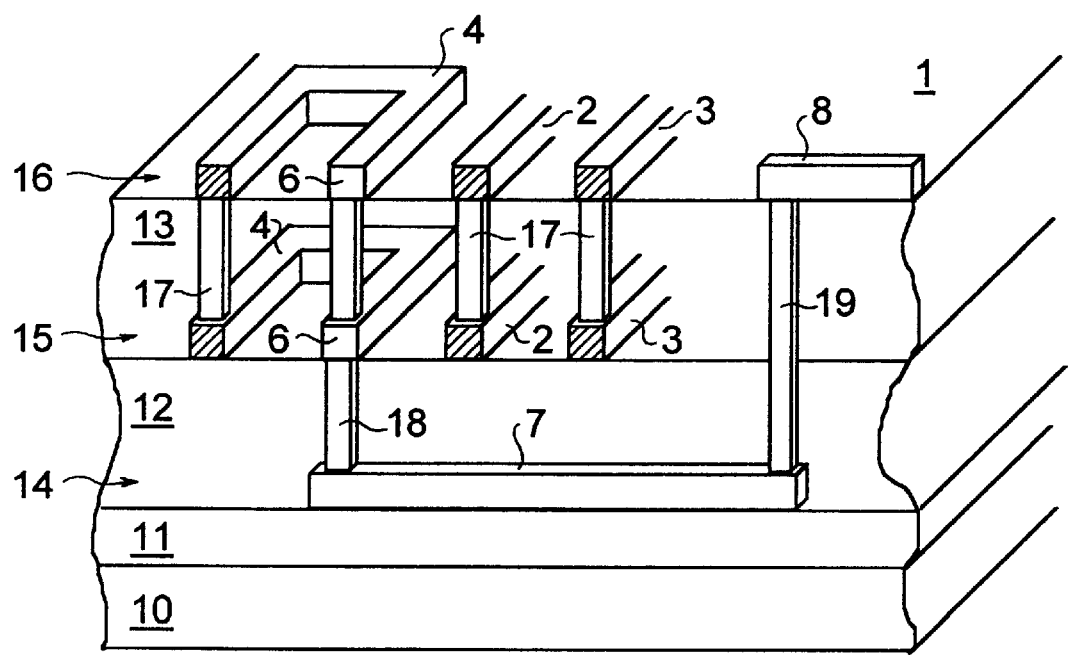
FIG. 2 is a schematic, not to scale, perspective cross section of the inductor of FIG. 1 along the section line II—II.

As shown in FIG. 2, the structure has three levels of metal on a silicon substrate 10. The first metal level 14 being the first level above a layer of silicon dioxide 11. At the first metal level 14 another layer of silicon dioxide 12 is deposited, electrically isolating the first metal level 14 from a next second metal level 15. At the second metal level 15 a layer of silicon dioxide 13 is arranged, electrically insulating the second metal level from a third metal level 16 at the layer of silicon dioxide 13.

The first metal level 14 is used as a cross-under to make an electrical connection to the central terminal 6 of the inner winding 4 of the spiral conductor 1. The first metal level 14 does not contribute to the mutual inductance of the inductor, rather the bridge or cross-under 7 increases the Direct Current (DC) resistance of the inductor.

The second and third metal level 15, 16 are identical spiral metal patterns, as shown in FIG. 1. Vias 17, filled with metal, interconnect the windings or turns 2 of the inductor 1. By the interconnections of the windings 9, each inductor winding or turn is is comprised of two layers of metal, connected in parallel to reduce their DC resistance. The central terminal 6 is connected through a via 18 with the bridge or cross-under 7 and the second terminal 8 connects by a via 19 to the cross-under 7.

In the substrate 10 several circuit elements can be formed following any integrated semi-conductor technology. For example, circuit elements forming with the inductor I an oscillator device.

Figure 3:
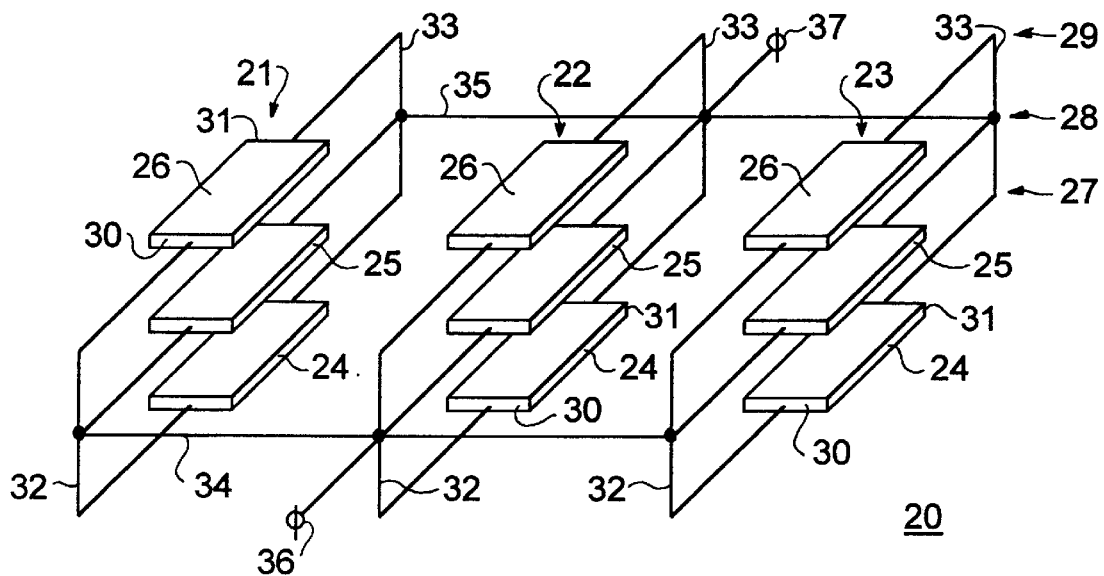
FIGS. 3, 4 and 5 are schematic, perspective views of inductor structures according to the present invention.

FIG. 3 shows a schematic, illustrative view of a preferred embodiment of a novel inductor structure 20 according to the present invention. In the embodiment shown, the inductor 20 is formed of three stacks 21, 22, 23, each comprised of three oppositely arranged electrically conducting strips 24, 25, 26.

The strips 24 are formed in a first level 27 of conducting material such as a metal like aluminum, silver, copper, tungsten alloy, gold, etc, whereas the strips 25 are arranged in a second metal level 28 and the strips 26 are arranged in a third metal level 29. The first, second and third levels 27, 28, 29 are comparable to the first, second and third metal levels 14, 15, 16 shown in FIG. 2.

The metal levels 27, 28, 29 are mutually separated by layers of electrically insulating material, such as the layers 11, 12, 13 of silicon dioxide on a silicon substrate 10 shown in FIG. 2. Those skilled in the art will appreciate that other suitable insulating layers can be used on a gallium arsenide (GaAs) substrate, for example. For clarity purposes, the insulating layers 11, 12, 13 are not shown in FIG. 3.

A strip 24, 25, 26 has a first end 30 and an opposite second end 31. At their first end 30 and second end 31, respectively, the strips 24, 25, Z6 of a stack 21, 22, 23 are parallel connected, as schematically indicated with interconnecting leads 32, 33, respectively. The interconnecting leads 32, 33 can be formed as tracks in a respective metal layer, whereas the interconnection of such tracks is performed through vias, such as the vias 17 of FIG. 2. However, the strips 24, 25, 26 of a stack 21, 2Z, 23 may be directly connected at their first and second end 30, 31 by vias 43 directly connecting to an end of a strip, without the use of conductive tracks, see FIG.

5. Further, strips 24, 26 of non-adjacent metal levels 27, 29 may be directly interconnected, for example.

In the embodiment shown, the stacks 21, 22 and 23 are parallel connected at their first and second ends 30, 31 respectively, as indicated with conducting leads 34, 35. The conducting leads 34, 35 may be formed in any of the metal layers 27, 28, 29. The choice of a metal layer may dependent on the position of the circuitry in the substrate or its connections, for example. The leads 34, 35 need not to be deployed at the same metal layer 27, 28, 29.

The connecting lead 34 terminates in a first terminal 36 of the inductor structure 20, whereas the lead 35 terminates in a second terminal 37 of the inductor structure 20.

With the so-called "parallel-parallel inductor" 20 according to the invention Q-values in excess of 25 at an inductance L ranging from 0.7–1 nH at frequencies up to 2 Gz are feasible. The exact values depend on the process parameters, such as the width, the length, the thickness and the number of strips 24, 25, 26 and stacks 21, 22, 23.

The stacking of strips 24, 25, 26 according to the present invention provides for a strong mutual inductance between closely spaced stacked layers, which is roughly twice as much as the mutual inductance between the strips in the same layer or level, whereas the parallel connection of the strips provides an extremely low DC resistance, typically <<1 Ohm. The contribution of a strip to the overall inductance is, besides its position, mainly determined by its length. Although the strips 24, 25, 26 may take any form, a rectangular, elongate plate form is preferred because this provides an easy and reliable model for calculation and simulation purposes.

Figure 4:
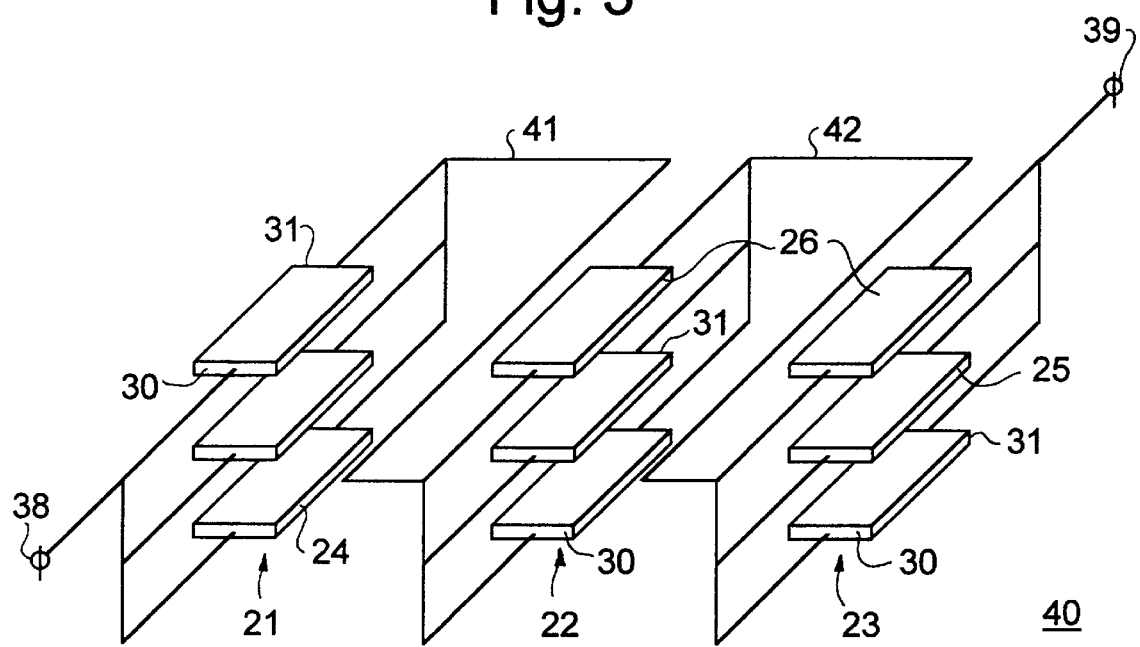

FIG. 4 shows another embodiment of the inductor according to the invention, wherein the stacks 21, 22, Z3 are series connected, In the embodiment shown, the interconnected first ends 30 of the strips 24, 25, 26 of the stack 21 form a first terminal 38 and the interconnected second ends 31 of the strips 24, 25, 26 of the stack 23 form a second terminal 39 of the inductor 40. As shown, the interconnected second ends 31 of the first stack 21 connect via a lead 41 to the interconnected first ends 30 of the second stack 22, whereas the interconnected second ends 31 of the stack 22 connect via a lead 42 to the interconnected first ends 30 of the third stack 23. The leads 41 and 42 may be formed in any of the metal layers 27, 28 or 29, in the form of conducting tracks or the like.

The so-called "series-parallel inductor" 40 of FIG. 4 distinguishes over the parallel-parallel inductor 20 of FIG. 3 by a higher inductance value L. However, in a similar configuration with respect to the number of strips and stacks, the series-parallel inductor 40 shows a lower Q-factor due to the higher DC resistance of the series connection of the stacks compared to a parallel connection of the stacks. Reference is made to equation (2) above.

Figure 5:
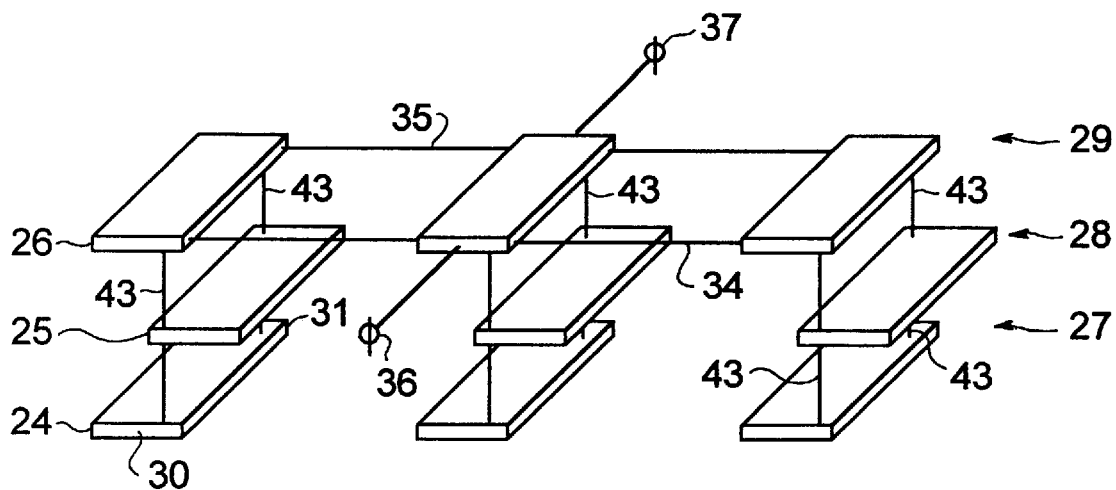

FIG. 5 shows an alternative arrangement of the strips 24, 25, 26, wherein strips of opposite layers 27, 28, 29 are staggeredly arranged, such to reduce the parasitic capacitance of the structure.

The novel inductor structure according to the present invention shows a very efficient occupation of available substrate area, compared to the prior art spiral inductors, of which the region 9 surrounded by the inner most winding 4 is not effectively used for providing circuitry of an integrated circuit of which the spiral inductor forms part of, see FIG. 1.

The inductor structure according to the present invention, due to its improved Q-factor, is particularly suitable for Radio Frequency (RF) integrated circuits, such as monolithic low-phase-noise oscillator devices for use in transceivers and Application Specific Integrated Circuits (ASIC's) for RF technology.

Figure 6:
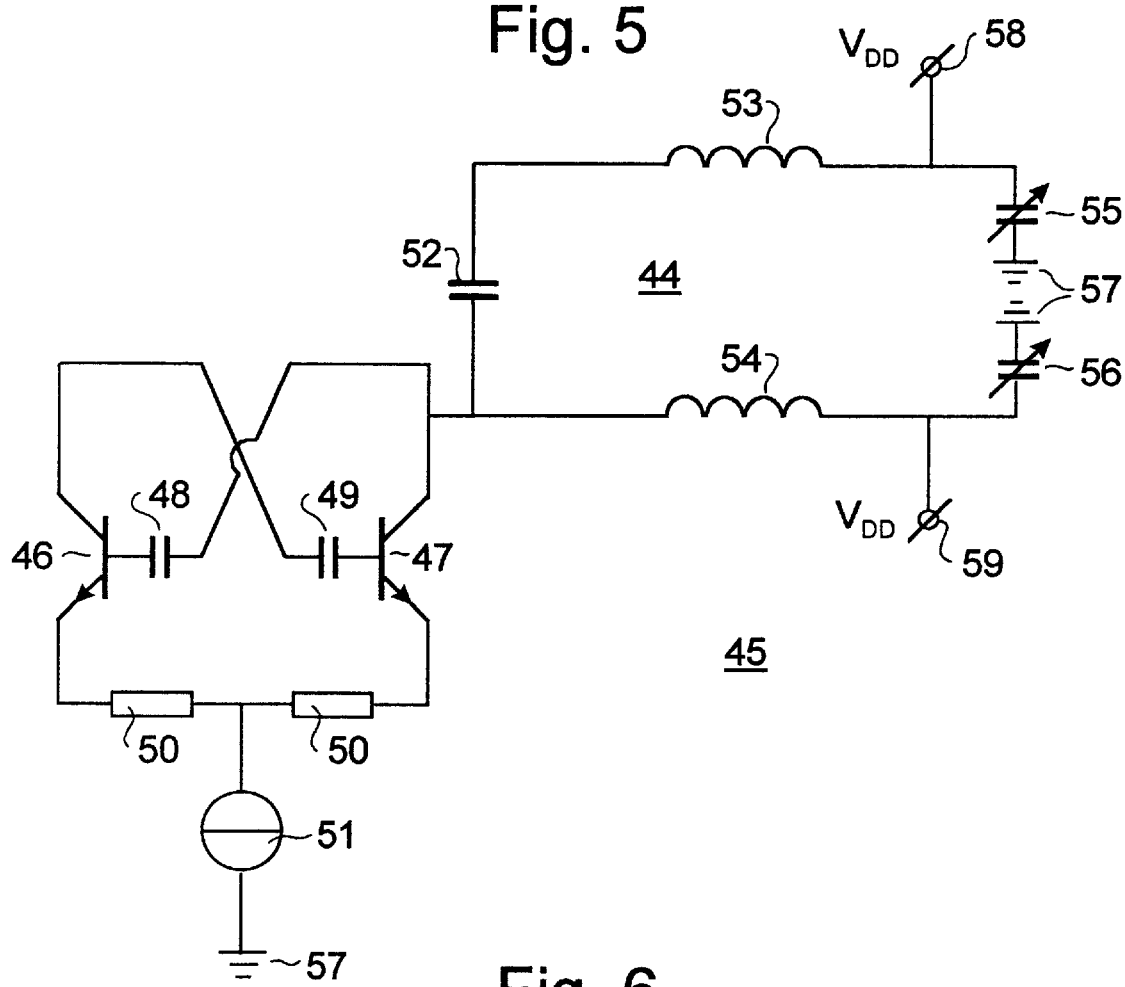
FIG. 6 is an electric circuit diagram of an oscillator circuit comprising an inductor according to the present invention.

FIG. 6 shows an electric circuit diagram of a balanced oscillator circuit 45 coupled with an on-chip balanced resonator circuit 44 comprising inductors 53, 54 according to the present invention. The active oscillator parts comprises two bipolar NPN transistors 46, 47. Transistor 46 connects with its base terminal through a capacitor 48 to the collector terminal of transistor 47. The base terminal of transistor 47 connects through a capacitor 49 to the collector terminal of transistor 46. Each of the emitter terminals of transistors 46 and 47 connect through a series resistor 50 to one end of a constant current source 51, another end of which connects to signal ground 57 of the circuit. Essentially, the active oscillator part consists of a balanced transadmittance amplifier with positive feed back having a passive balanced parallel resonator circuit coupled between the collector terminals of the transadmittance stage.

The balanced resonator circuit 44 comprises a capacitor 52 connected between the collector terminals of the transistors 46 and is 47, which in turn connect through the inductors 53 and 54 to power terminals $V_{DD}$, 58, 59 of the circuit. Capacitors 55 and 56, connecting between $V_{DD}$ and signal ground 57, respectively, complete the resonator circuit 44 as shown. The capacitors 55, 56 may be of variable type, such to provide a tunable balanced oscillator circuit.

The novel inductor structure according to the invention can be realized with conventional integrated circuit technology. In particular, a planarisation technique known as "back etching" is very suitable for producing the parallel-parallel and parallel-series configuration described. An example of a "back etching" technique is disclosed by European patent application 0 599 074, which is herein included by reference.

While the invention has been described in terms of preferred embodiments, those skilled in the art will appreciate that various changes in the arrangement and the number of parts which have been described and illustrated in order to explain the nature of this invention may be made without departing from the principal and scope of the invention as set forth in the appended claims.

What is claimed is:

1. An integrated circuit comprising multiple mutually separated levels of electrically conducting material, each level comprising a plurality of adjacently arranged strips separated from another, a strip comprising a first and second end, wherein strips of different levels are electrically parallel connected, such to form a plurality of stacks of parallel connected strips, said stacks being interconnected to form an inductor having a first and second terminal.

2. An integrated circuit according to claim 1, wherein the stacks are connected in parallel, having the first terminal at the interconnected first ends and the second terminal at the interconnected second ends of the stacks.

3. An integrated circuit comprising multiple mutually separated levels of electrically conducting material, each level comprising a plurality of adjacently arranged strips separated from another, a strip comprising a first and second end, wherein strips of different levels are electrically parallel connected, such to form a plurality of stacks of parallel connected strips, said stacks being interconnected to form an inductor having a first and second terminal, wherein the stacks are series connected, having the first terminal at a first end and the second terminal at a second end of the series connection.

4. An integrated circuit according to claim 1, wherein strips of different levels, the strips forming a stack, are oppositely arranged.

5. An integrated circuit comprising multiple mutually separated levels of electrically conducting material, each level comprising a plurality of adjacently arranged strips separated from another, a strip comprising a first and second end, wherein strips of different levels are electrically parallel connected, such to form a plurality of stacks of parallel connected strips, said stacks being interconnected to form an inductor having a first and second terminal, wherein strips of different levels are arranged in a staggered fashion.

6. An integrated circuit according to claim 1, wherein strips of adjacent levels are interconnected.

7. An integrated circuit according to claim 1, comprising circuit elements connecting to the first and second terminal of at least one inductor and arranged to form an oscillator device.

8. An integrated circuit comprising multiple mutually separated levels of electrically conducting material, each level comprising a plurality of adjacently arranged strips separated from another, a strip comprising a first and second end, wherein strips of different levels are electrically parallel connected, such to form a plurality of stacks of parallel connected strips, said stacks being interconnected to form an inductor having a first and second terminal, wherein the levels of electrically conducting material are formed on a semiconductor substrate, the levels being separated by layers of electrically insulating material, and wherein the electrically conducting material is a metal.

9. An integrated circuit according to claim 8, wherein the levels of conducting material and electrically insulating material are formed by a back etching semiconductor manufacturing technique.

10. An integrated circuit according to claim 8, wherein the semiconductor substrate is silicon and gallium arsenide (GaAs).

11. An integrated circuit according to claim 10, wherein the electrically insulating material is silicon dioxide.

12. An integrated circuit according to claim 8, wherein the metal is one of aluminum, tungsten alloy and gold.

13. An integrated circuit according to claim 8, wherein the electrically insulating material is silicon dioxide.

14. An integrated circuit according to claim 8, wherein the metal is one of aluminum, tungsten alloy and gold.

* * * * *